(12) United States Patent
Isokawa et al.

(10) Patent No.: US 6,670,648 B2
(45) Date of Patent: Dec. 30, 2003

(54) SEMICONDUCTOR LIGHT-EMITTING DEVICE HAVING A REFLECTIVE CASE

(75) Inventors: Shinji Isokawa, Kyoto (JP); Tadahiro Okazaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/196,205

(22) Filed: Jul. 17, 2002

(65) Prior Publication Data

US 2003/0025117 A1 Feb. 6, 2003

(30) Foreign Application Priority Data

Jul. 19, 2001 (JP) ........................................ 2001-219079
Jan. 15, 2002 (JP) ........................................ 2002-005547

(51) Int. Cl.[7] ............................................. H01L 29/22
(52) U.S. Cl. ............................. 257/99; 257/98; 257/100
(58) Field of Search ............................. 257/99, 100, 98

(56) References Cited

U.S. PATENT DOCUMENTS 3,883,772 A * 5/1975 Wako et al. ................. 313/499
6,274,890 B1 * 8/2001 Oshio et al. .................. 257/98

* cited by examiner

*Primary Examiner*—Sara Crane
(74) *Attorney, Agent, or Firm*—Morgan, Lewis & Bockius LLP (57) ABSTRACT

A semiconductor light-emitting device has a semiconductor light-emitting element 3 mounted on an electrode 2 formed on a surface of an insulating substrate 1, and has a reflective case 5 provided on the insulating substrate 1 so as to reflect the light from the light-emitting element 3, with the space inside the reflective case 5 sealed with a translucent resin 6. The reflective case 5 has a grained portion 51 formed over at least part of the surface thereof over which it makes contact with the translucent resin 6. This effectively prevents the translucent resin from coming off the reflective case. To enable the semiconductor light-emitting device to emit light with more even intensity in all directions, the grained portion is formed, preferably, at least in the portions of the reflective case 5 that face the side surfaces of the semiconductor light-emitting element.

6 Claims, 7 Drawing Sheets

TRANSLUCENT RESIN

FIG. 11

SEMICONDUCTOR LIGHT-EMITTING DEVICE HAVING A REFLECTIVE CASE

BACKGROUND OF THE INVENTION

1. Field of the Invention

The present invention relates to a semiconductor light-emitting device, and more particularly to a semiconductor light-emitting device having a reflective case provided on a insulating substrate.

2. Description of the Prior Art

Figure 10:
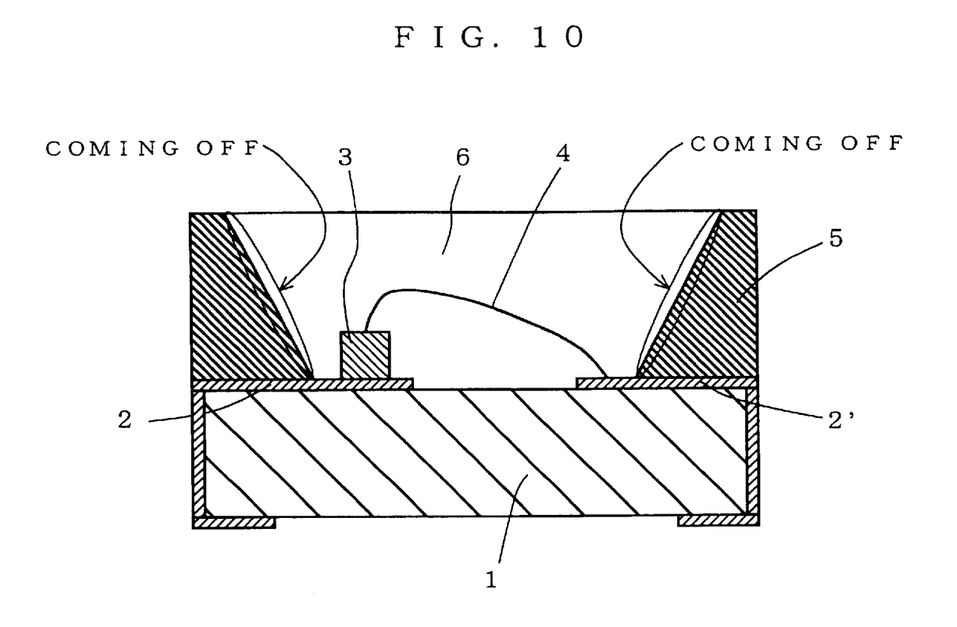
FIG. 10 is a side sectional view showing an example of a conventional semiconductor light-emitting device.

Semiconductor light-emitting elements, such as light-emitting diode elements, often have a reflective case provided around them to permit the light emitted from the semiconductor light-emitting elements to be directed in a particular direction. FIG. 10 is a side sectional view showing an example of a conventional semiconductor light-emitting device having a reflective case 5 provided on an insulating substrate 1. In the conventional semiconductor light-emitting device, the space inside the reflective case 5 is sealed with a translucent resin 6, of which a typical example is a thermosetting resin such as epoxy resin. Thus, the translucent resin 6 is first poured into the reflective case 5, and is then cured by being heated to a temperature a few of tens of degrees over 100° C.

However, the translucent resin 6 usually does not adhere well to the material of reflective case 5, and, when the translucent resin 6 is cured by application of heat in a reflow furnace or the like, the translucent resin 6 often comes off the reflective case 5, producing a defective device.

Figure 11:
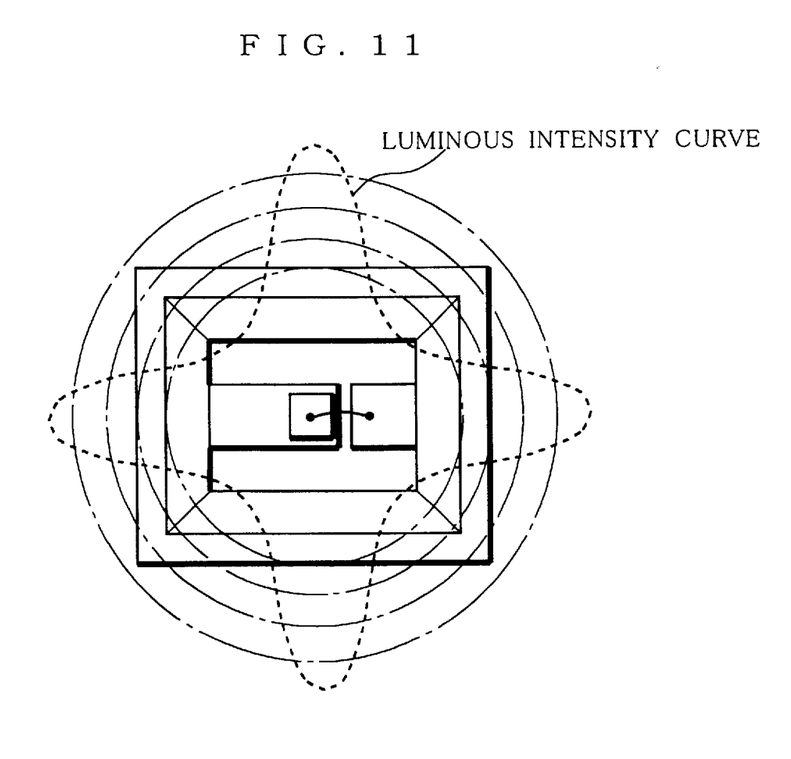
FIG. 11 is a diagram showing the luminous intensity curve of the light emitted from the semiconductor light-emitting device shown in FIG. 10 when viewed in a plan view.

Moreover, in general, the light emitted from a light-emitting element 3 through the corners thereof is weaker than the light emitted therefrom through the sides thereof, and thus, as shown in a luminous intensity curve diagram in FIG. 11, the device, when viewed in a plan view, emits light with uneven intensity in different directions.

SUMMARY OF THE INVENTION

An object of the present invention is to provide a light-emitting device in which, even if the space inside a reflective case is sealed with a translucent resin that does not adhere well to the material of the reflective case, the translucent resin does not come off the reflective case after being cured.

Another object of the present invention is to provide a light-emitting device that emits light with more even intensity in all directions.

To achieve the above object, according to the present invention, a semiconductor light-emitting device has a semiconductor light-emitting element mounted on an electrode formed on a surface of an insulating substrate, and has a reflective case provided on the insulating substrate so as to reflect the light from the semiconductor light-emitting element, with the space inside the reflective case sealed with a translucent resin. Moreover, the reflective case has a grained portion formed over at least part of the surface thereof over which its makes contact with the translucent resin. Structured in this way, the semiconductor light-emitting device according to the invention effectively prevents the translucent resin from coming off the reflective case.

To enhance the adherence between the translucent resin and the reflective case and simultaneously enable the device to emit light with more even intensity in all directions, it is preferable that the grained portion be formed at least in the portions of the reflective case that face the side surfaces of the semiconductor light-emitting element.

Figure 5:
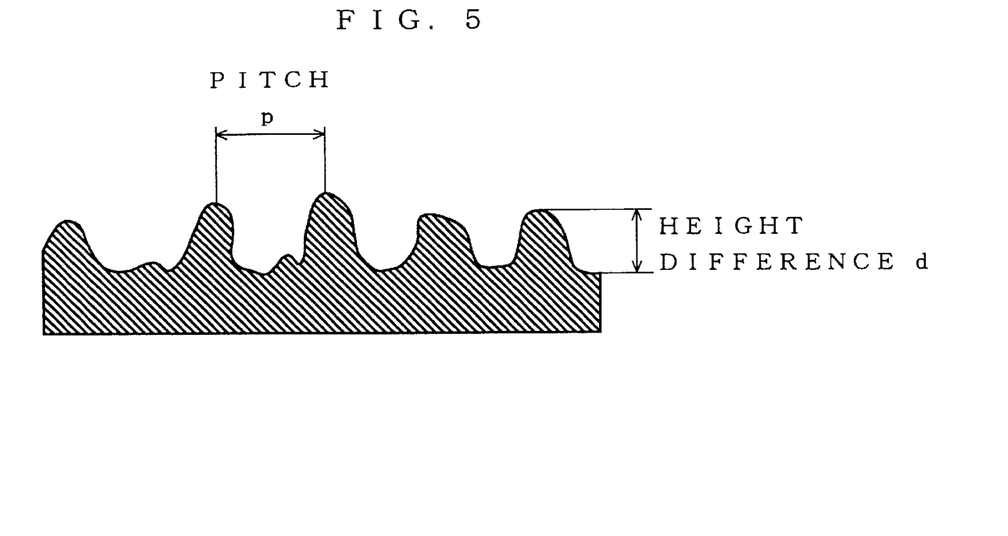
FIG. 5 is a diagram showing the depression-to-projection height difference and projection-to-projection pitch of the grained portion.

To more securely prevent the translucent resin from coming off the reflective case, it is preferable that the grained portion be formed with a depression-to-projection height difference of 12 μm or more, or with a projection-to-projection pitch of 20 μm or less. As shown in FIG. 5, in the present invention, the depression-to-projection height difference denotes the ten-point average surface roughness, and the projection-to-projection pitch denotes the distance from one projection to the next.

For higher productivity of the device or out of other considerations, the insulating substrate and the reflective case may be formed integrally A preferred material of the reflective case is a liquid crystal polymer for its heat resistance and low thermal expansion, and a preferred example of the translucent resin is epoxy resin for its translucence.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

As a result of an intensive study in search of a way to prevent a translucent resin from coming off a reflective case in a semiconductor light-emitting device as occurs when the translucent resin is cured by application of heat, the inventor of the present invention has found out that it is possible, by forming a grained portion on the surface of the reflective case over which it makes contact with the translucent resin so that the reflective case and the translucent resin make contact with each other over a larger contact area and that the translucent resin reaches into depressions of the grained portion, to effectively prevent the translucent resin from coming off the reflective case when the translucent resin is cured by application of heat, which finding has led the inventor to the present invention. Hereinafter, semiconductor light-emitting devices embodying the present invention will be described with reference to the drawings. It is to be understood, however, that the present invention is not limited in any way by these embodiments.

Figure 1:
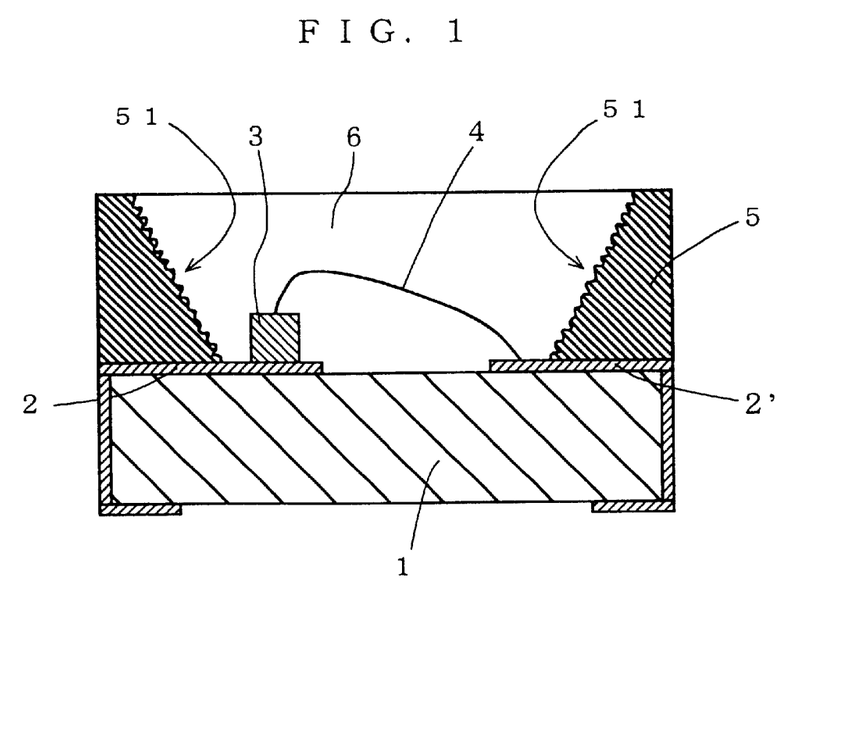
FIG. 1 is a side sectional view showing an example of a semiconductor light-emitting device according to the invention.

FIG. 1 is a partial sectional view showing an example of a semiconductor light-emitting device according to the present invention. On an insulating substrate 1, a pair of electrodes 2 and 2' are formed. On one electrode 2, a light-emitting element 3 is mounted, and the top-surface electrode of the light-emitting element 3 is connected to the other electrode 2' by a bonding wire 4. A reflective case 5 having an opening in the top surface thereof is mounted on the insulating substrate 1 in such a way as to enclose the light-emitting element 3, the bonding wire 4, and parts of the electrodes 2 and 2', and the space inside the reflective case 5 is filled with a transparent resin 6, which is then cured by application of heat.

Figure 2:
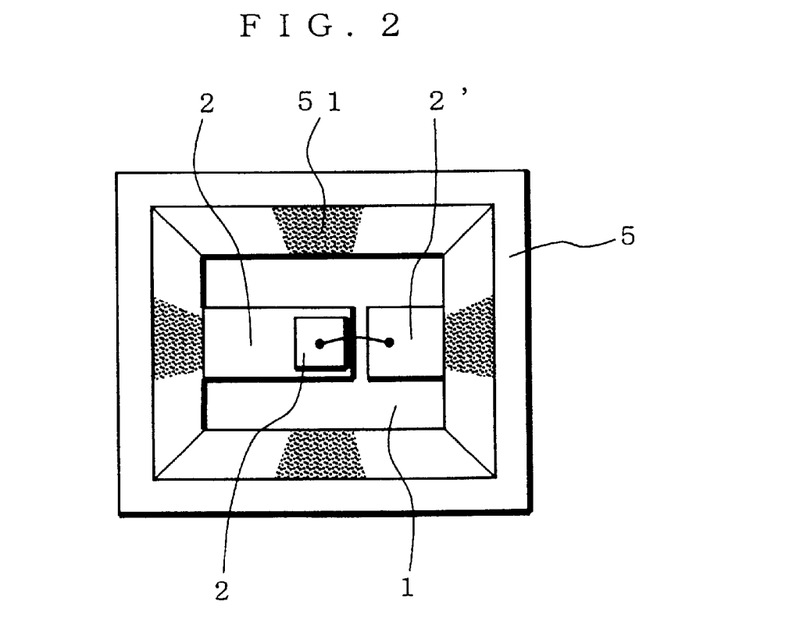
FIG. 2 is a plan view showing another example of a semiconductor light-emitting device according to the invention.
Figure 3:
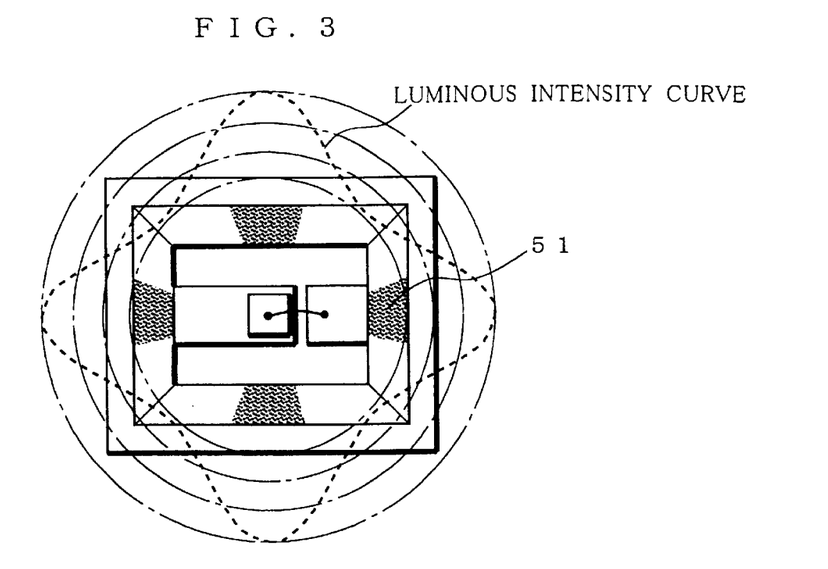
FIG. 3 is a diagram showing the luminous intensity curve of the light emitted from the semiconductor light-emitting device shown in FIG. 2 when viewed in a plan view.
Figure 4A:
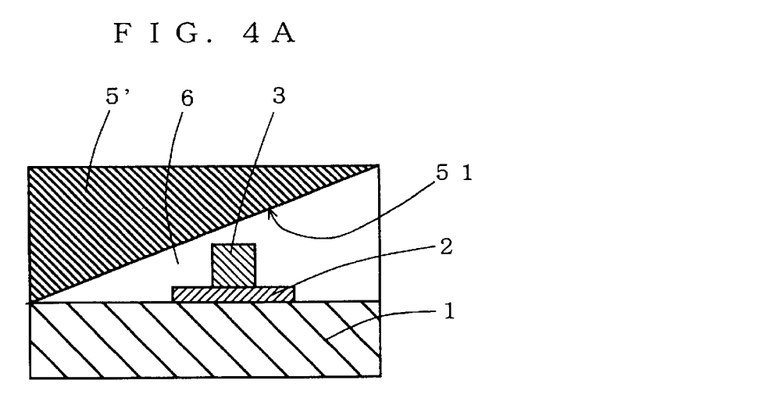
FIGS. 4A and 4B are side sectional views showing other examples of semiconductor light-emitting devices according to the invention.
Figure 4B:
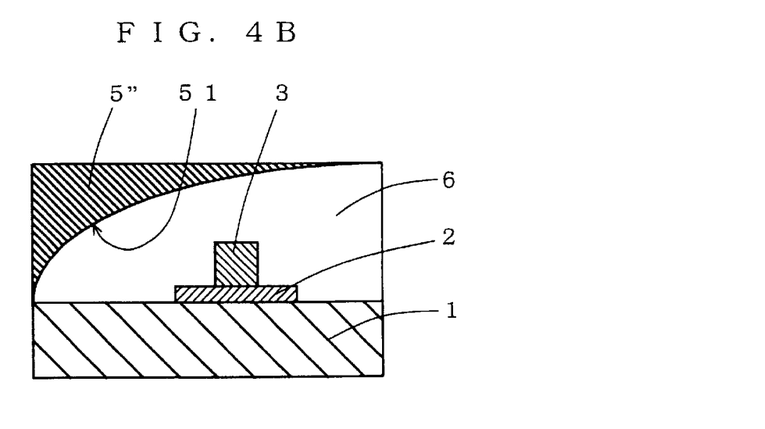

The reflective case 5 used here has a grained portion 51 formed on its inner wall. The grained portion 51 is formed over at least part of the surface of the reflective case 5 over which it makes contact with the transparent resin. To enable the semiconductor light-emitting device to emit light with more even intensity in all directions, it is preferable that the grained portion 51 be formed at least in the portions of the reflective case 5 that face the side surfaces of the semiconductor light-emitting element. FIG. 2 is a plan view of a semiconductor light-emitting device having a grained portion 51 formed in the portions of a reflective case 5 that face the side surfaces of a semiconductor light-emitting element. FIG. 3 shows the luminous intensity curve of the light emitted from this device as viewed in a plan view. As will be clear from a comparison between FIGS. 3 and 11, the semiconductor light-emitting device having the grained portion 51 formed in the portions of the reflective case 5 that face the side surfaces of the semiconductor light-emitting element emits light with more even intensity in all directions than the conventional semiconductor light-emitting device shown in FIG. 11. Needless to say, to effectively prevent the translucent resin 6 from coming off the reflective case 5, it is preferable that the grained portion 51 be formed over the whole surface of the reflective case 5 over which it makes contact with the translucent resin 6.

It is preferable that the grained portion be formed with a depression-to-projection height difference of 12 μm or more. With a depression-to-projection height difference of less than 12 μm, it may be impossible to secure a sufficiently large contact area, and thus to completely prevent the translucent resin from coming off. In addition, it may be impossible to reflect sufficiently irregularly the light emitted from the light-emitting element, and thus to emit the light with more even intensity.

It is preferable that the grained portion be formed with a projection-to-projection pitch of 20 μm or less. With a projection-to-projection pitch of more than 20 μm, it may be impossible to secure a sufficiently large contact area, and thus to completely prevent the translucent resin from coming off. In addition, it may be impossible to reflect sufficiently irregularly the light emitted from the light-emitting element, and thus to emit the light with more even intensity. There is no particular lower limit to the projection-to-projection pitch of the grained portion. However, with a projection-to-projection pitch of less than 12 μm, projections may have so acute angles at their tips as to cause the translucent resin to come off, and therefore a preferred lower limit of the projection-to-projection pitch is 12 μm.

The grained portion on the surface of the reflective case can be formed by any conventionally know method. For example, the reflective case is molded with a mold for injection molding which has been subjected to surface treatment to have fine surface irregularities formed on its surface. Alternatively, after the reflective case has been molded, it is subjected to blasting so that its surface is grained. From the viewpoint of productivity, it is preferable to form the reflective case by injection molding using a mold for injection molding which has fine surface irregularities formed on its surface. Examples of surface treatment performed to grain the surface of the mold include etching and electroforming.

The reflective case used in the present invention may be formed out of any conventionally known material as long as it has heat resistance, low thermal expansion, and electrical insulation. A preferred material is a liquid crystal polymer, because it excels in all of the properties just mentioned, examples including liquid crystal polymers based on polyester, polyester amide, polyazomethine, and the like. Among these, a liquid crystal polymer based on aromatic polyester is particularly preferred.

In the device shown in FIG. 1, to permit light to be emitted upward, the reflective case 5 is so shaped as to have an opening in the top surface thereof. In practice, however, the reflective case 5 may be shaped in any other manner so as to have an opening in the direction in which light is required to be emitted. FIGS. 2A and 2B are sectional views of examples of semiconductor light-emitting devices that emit light sideways. The devices shown in FIGS. 2A and 2B both emit light rightward. In either of these devices, a grained portion 51 is formed over the whole surface of the reflective case 5' or 5" over which it makes contact with the translucent resin 6.

The translucent resin used in the present invention may be of any type as long as it is translucent, examples including epoxy resin, unsaturated polyester resin, silicone resin, and urea-melamine resin. Among these, epoxy resin is suitably used for its good translucence and other properties. The epoxy resin may be of any type as long as it has two or more epoxy groups per molecule and is intended for use as material for epoxy resin molding, examples including: epoxidized novolac resin of a phenol and an aldehyde, as represented by phenolic novolac type epoxy resin and ortho-cresol novolac type epoxy resin; diglycidyl ester type epoxy resin obtained through reaction with epichlorohydrin of a diglycidyl ether such as bisphenol A, bisphenol F, bisphenol S, or hydrogenated bisphenol A and a polybasic acid such as phthalic acid or dimer acid; glycidyl amine type epoxy resin obtained through reaction with epichlorohydrin of a polyamine such as diaminodiphenyl methane or isocyanuric acid; acyclic aliphatic epoxy resin obtained through oxidation of olefin linkage with a peracid such as peracetic acid; and alicyclic epoxy resin. These may be used singly or as a mixture of two or more of them. Preferably, any of these types of epoxy resin needs to be purified sufficiently and, irrespective of whether it is liquid or solid at ordinary temperature, appear as transparent as possible when liquefied.

The device according to the present invention is fabricated, for example, in the following manner. First, the insulating substrate is fabricated. Specifically, in an insulating substrate having copper foil laid on both of its top and bottom surfaces, a plurality of slits 8 (shown in FIG. 6) are formed to form a plurality of rungs 7 (shown in FIG. 6). Next, a photoresist is applied, exposed, and developed so that the portions of the copper foil corresponding to the top-surface and bottom-surface portions of the electrodes 2 and 2' (shown in FIG. 6) are coated with the photoresist. With this resist pattern used as a resist against etching, unnecessary portions of the copper foil is removed by etching. Then, by electroless plating, Cu layers are laid on the side surfaces of the rungs 7 to form the side-surface portions of the electrodes. Thereafter, on all portions of the copper foil and layers corresponding to the electrodes, including those on the side surfaces of the rungs 7, layers of Cu, Ni, and Au are formed on top of one another by electroplating. In this way, the insulating substrate 1 is fabricated.

Figure 6:
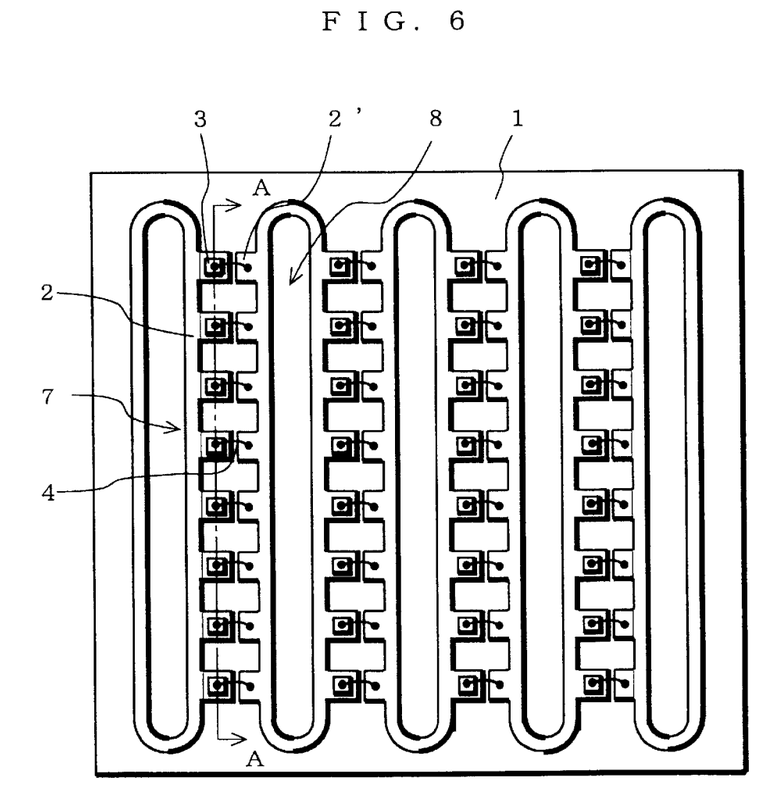
FIG. 6 is a plan view showing a intermediate product in the fabrication process.

Next, as shown in a plan view in FIG. 6, on the insulating substrate 1 thus fabricated, semiconductor light-emitting elements 3 are bonded on the top surfaces of the electrodes 2 located along one side of each rung 7. Then the top-surface electrode of each semiconductor light-emitting element is connected to the top surface of the other electrode 2' corresponding thereto by a bonding wire.

Figure 7A:
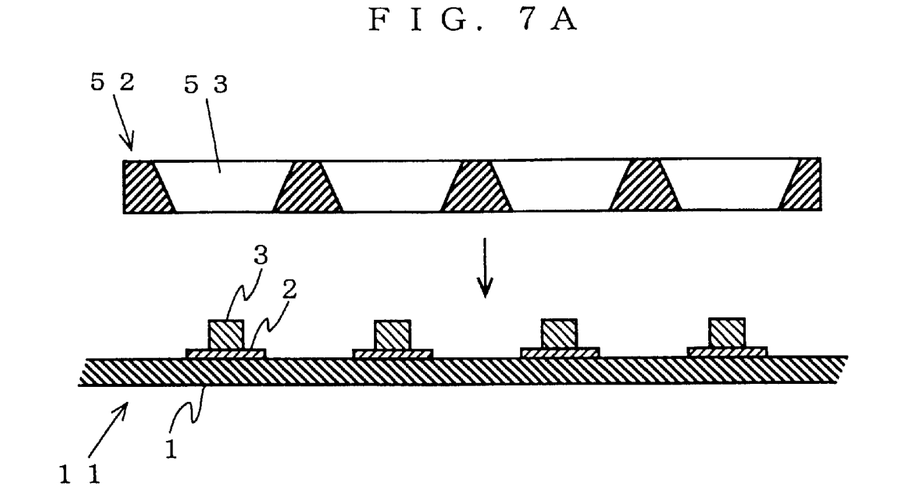
FIGS. 7A to 7D are diagrams showing the steps of mounting the reflective case and sealing with the translucent resin.
Figure 7B:
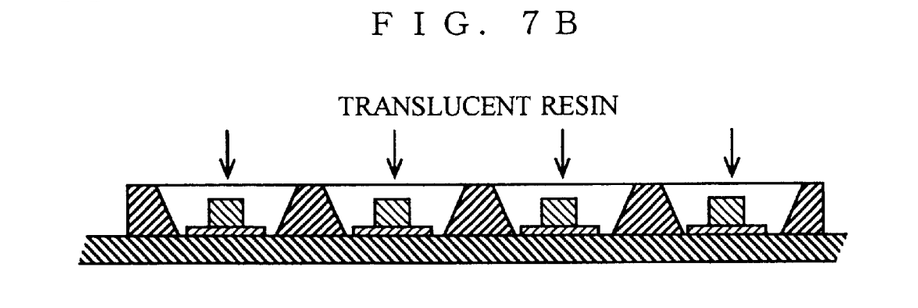
Figure 7C:
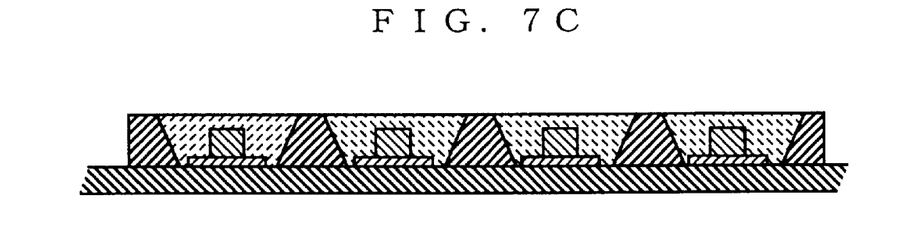
Figure 7D:
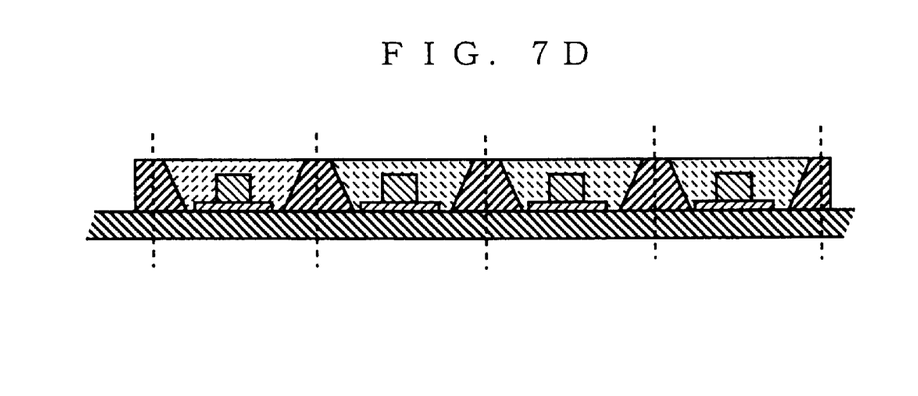

Then, the mounting of the reflective case and the sealing with the translucent resin are performed in the following manner. FIGS. 7A to 7D show a sectional view of one of the rungs 7 shown in FIG. 6 along its longer sides (along line A—A). On top of the insulating substrate 1 is firmly fitted, with adhesive, a continuous reflective case member 52 having holes 53, so deep as to completely enclose the bonding wires bonded to the top surfaces of the semiconductor light-emitting elements 3, formed in places corresponding to the semiconductor light-emitting elements 3 (FIG. 7A). Next, epoxy resin, as a translucent resin, is poured into the holes 53 of the continuous reflective case member 52 (FIG. 7B). Then, the epoxy resin is cured at a predetermined temperature (FIG. 7C), and thereafter the entirety of what has thus far been fabricated is cut, by dicing or the like, along the broken lines to obtain semiconductor light-emitting devices according to the invention (FIG. 7D).

Figure 8:
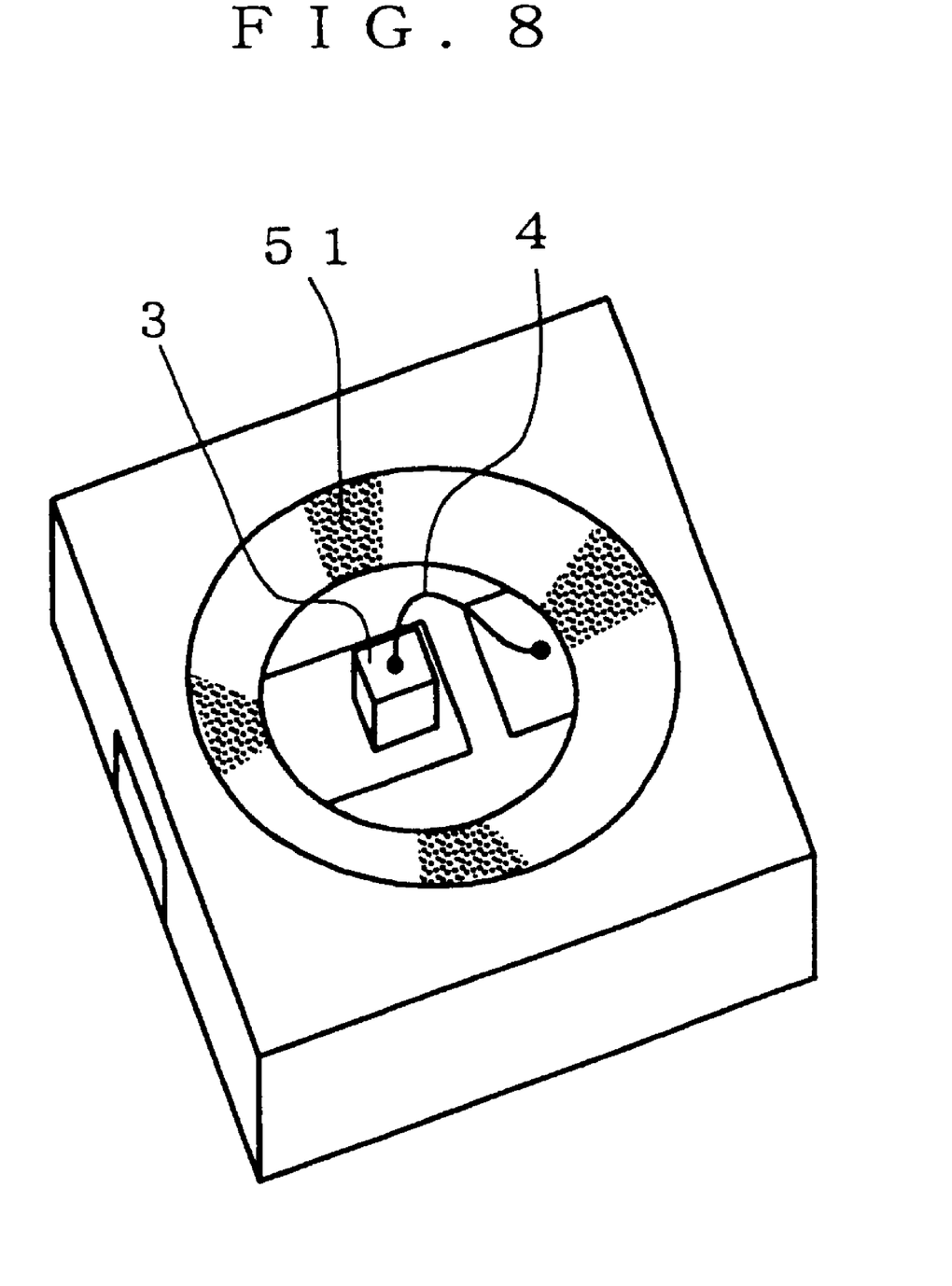
FIG. 8 is a perspective view showing an example of a semiconductor light-emitting device having an insulating substrate and a reflective case formed integrally.

In the semiconductor light-emitting device shown in FIG. 1, the insulating substrate and the reflective case are fabricated separately, and are then fitted firmly together with epoxy-based adhesive or the like. However, for higher productivity or out of other considerations, the insulating substrate and the reflective case may be formed integrally. FIG. 8 shows an example of a semiconductor light-emitting device having an insulating substrate and a reflective case formed integrally, and FIGS. 9A to 9F show an example of the fabrication process of this semiconductor light-emitting device.

Figure 9A:
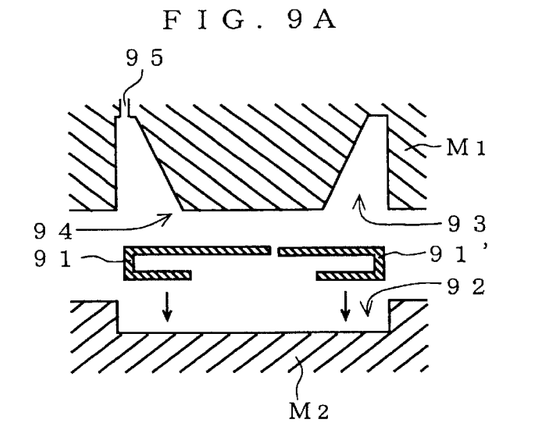
FIGS. 9A to 9F are diagrams showing an example of the fabrication process of the semiconductor light-emitting device shown in FIG. 8.
Figure 9B:
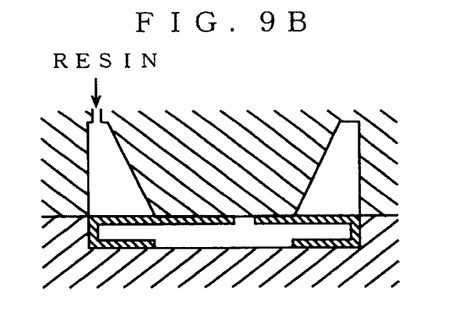
Figure 9C:
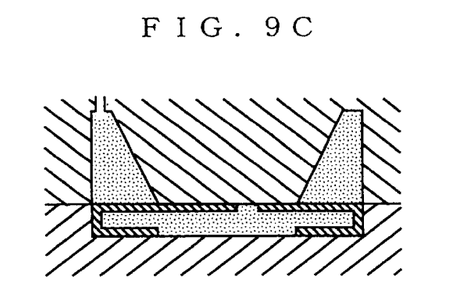
Figure 9D:
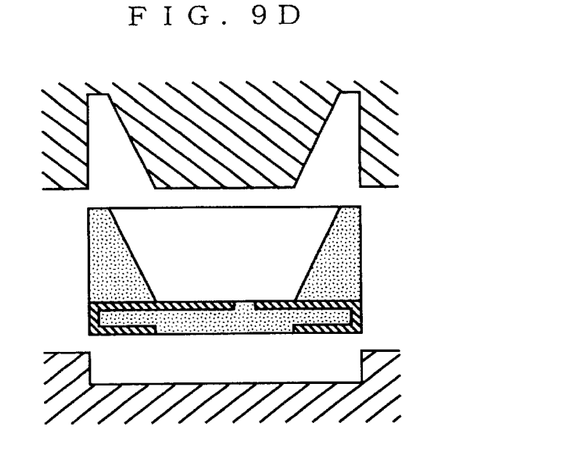
Figure 9E:
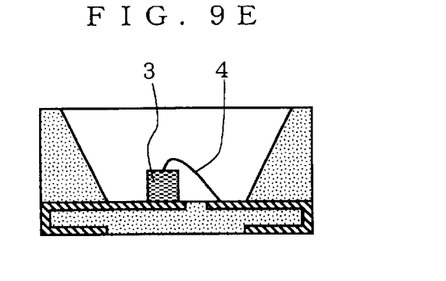
Figure 9F:
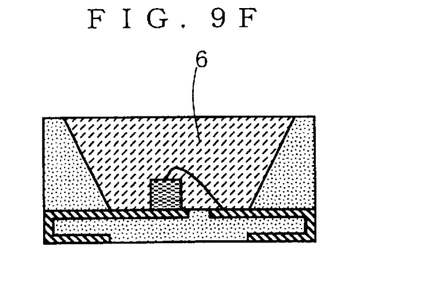

In FIGS. 9A to 9F, first, metal members 91 and 91' each having a C-shaped section, which will serve as electrodes, are placed in a lower mold $M_2$ having a rectangular recess 92 formed therein, which will serve as a substrate (FIG. 9A). Then, on top of the lower mold $M_2$, an upper mold $M_1$ is placed that has a rectangular recess 93 formed therein and has a protrusion 94, of which the diameter continuously decreases downward, formed in the center of the rectangular recess 93 (FIG. 9B). Here, the outer surface of the protrusion 94 is grained in predetermined portions thereof corresponding to the grained portion. Then, a resin is injected into the space formed between the upper and lower molds $M_1$ and $M_2$ through a resin injection hole 95 (FIG. 9C). After cooling, the molding thus formed, i.e., an insulating substrate having a reflective case formed integrally therewith, is released from the molds (FIG. 9D). Next, a semiconductor light-emitting element 3 is bonded on one 91 of the metal members exposed at the bottom of a conical recess 96, and the top-surface electrode of the semiconductor light-emitting element 3 is connected to the other metal member 91' with a bonding wire 4 (FIG. 9E). Then, a translucent resin 6 such as epoxy resin is poured into the conical recess 96, and is then cured by application of heat (FIG. 9F).

Semiconductor light-emitting devices according to the present invention are used, for example, as backlights for liquid crystal display devices, point light sources in optical fiber communication devices and photocouplers, and indicators in household appliances.

What is claimed is:

1. A semiconductor light-emitting device having a semiconductor light-emitting element mounted on an electrode formed on a surface of an insulating substrate, and having a reflective case provided on the insulating substrate so as to reflect light from the light-emitting element, with a space inside the reflective case sealed with a translucent resin, wherein the reflective case has a grained portion formed over at least part of a surface thereof over which the reflective case makes contact with the translucent resin, the grained portion being formed with a projection-to-projection pitch in a range of from 12 $\mu$m to 20 $\mu$m.

2. A semiconductor light-emitting device as claimed in claim 1, wherein the grained portion is formed at least in portions of the reflective case that face side surfaces of the semiconductor light-emitting element.

3. A semiconductor light-emitting device as claimed in claim 1, wherein the grained portion is formed with a depression-to-projection height difference of 12 $\mu$m or more.

4. A semiconductor light-emitting device as claimed in claim 1, wherein the insulating substrate and the reflective case are formed integrally.

5. A semiconductor light-emitting device as claimed in claim 1, wherein a liquid crystal polymer is used as a material of the reflective case, and epoxy resin is used as the translucent resin.

6. A semiconductor light-emitting device as claimed in claim 1, wherein the grained portion is formed all over the surface of the reflective case over which the reflective case makes contact with the translucent resin.

* * * * *